(12) United States Patent
Umemoto et al.

(10) Patent No.: US 7,202,410 B2
(45) Date of Patent: Apr. 10, 2007

(54) PHOTOVOLTAIC MODULE HAVING LIGHT RECEPTIVE, GLASS LAMINATE STRUCTURE AND PHOTOVOLTAIC MODULE HAVING LIGHT RECEPTIVE, MULTI-LAYER STRUCTURE

(75) Inventors: Akimasa Umemoto, Sakurai (JP); Hiroyuki Yoda, Kitakatsuragi-gun (JP); Noriaki Shibuya, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 55 days.

(21) Appl. No.: 10/126,966

(22) Filed: Apr. 22, 2002

(65) Prior Publication Data

US 2002/0153038 A1    Oct. 24, 2002

(30) Foreign Application Priority Data

Apr. 20, 2001  (JP)  ............................. 2001-123187

(51) Int. Cl.
*H01L 31/00* (2006.01)
(52) U.S. Cl. ........................................ 136/251; 136/244
(58) Field of Classification Search ................ 136/251, 136/244; 257/432, 433, 434, 798, 790, 794; 52/173.3
See application file for complete search history.

(56) References Cited

U.S. PATENT DOCUMENTS

| | | | | |
|---|---|---|---|---|
| 2,986,644 A | * | 5/1961 | Cheroff ........................ 250/225 |
| 2,993,945 A | * | 7/1961 | Huth ............................ 136/255 |
| 3,957,537 A | * | 5/1976 | Baskett et al. ................ 136/251 |
| 3,988,647 A | * | 10/1976 | Bolon et al. .................. 361/779 |
| 4,097,310 A | * | 6/1978 | Lindmayer .................... 136/261 |
| 4,509,248 A | * | 4/1985 | Spitzer et al. ................. 438/64 |
| 4,824,882 A | * | 4/1989 | Nakamura et al. ............. 524/89 |
| 5,059,254 A | * | 10/1991 | Yaba et al. ................... 136/251 |
| 5,221,363 A | * | 6/1993 | Gillard ........................ 136/248 |
| 5,228,924 A | * | 7/1993 | Barker et al. ................. 136/246 |
| 5,728,230 A | * | 3/1998 | Komori et al. ............... 136/251 |
| 5,758,204 A | * | 5/1998 | Haneda et al. ................. 399/66 |
| 5,951,786 A | * | 9/1999 | Gee et al. ..................... 136/256 |
| 6,288,325 B1 | * | 9/2001 | Jansen et al. ................ 136/249 |
| 6,437,235 B1 | * | 8/2002 | Komori et al. ............... 136/251 |
| 6,441,300 B2 | * | 8/2002 | Sannomiya et al. ......... 136/251 |
| 6,528,718 B2 | * | 3/2003 | Yoda et al. ................... 136/251 |
| 2002/0020440 A1 | * | 2/2002 | Yoshimine et al. .......... 136/251 |
| 2003/0010378 A1 | * | 1/2003 | Yoda et al. ................... 136/251 |
| 2003/0029493 A1 | * | 2/2003 | Plessing ....................... 136/251 |

FOREIGN PATENT DOCUMENTS

JP          54-49729 A    *    4/1979

(Continued)

OTHER PUBLICATIONS

PV Building Design Guide, issued by NEDO on Sep. 20, 2000, 9 pages.

(Continued)

*Primary Examiner*—Nam Nguyen
*Assistant Examiner*—Jeffrey Barton
(74) *Attorney, Agent, or Firm*—Nixon & Vanderhye P.C.

(57) ABSTRACT

Between a light receiving glass and a backside glass a plurality of solar battery cells form a matrix of solar battery cells and a translucent, intermediate layer of film is also interposed to configure a photovoltaic module having a light receptive, glass laminate structure, wherein at least one of a back surface of the solar battery cell and a front surface of the backside glass observed indoors has a film stuck thereon. For a photovoltaic module having a light receptive, multi-layer structure, a glass observed indoors also has a film stuck thereon. The solar battery cell can thus have a back surface with a lead frame, a mark of paste applied for collection of electricity covered with the film to provide an improved, externally observed design and an increased product value.

18 Claims, 5 Drawing Sheets

FOREIGN PATENT DOCUMENTS

| | | | | |
|---|---|---|---|---|
| JP | 3-200378 | A | * | 9/1991 |
| JP | 5-310035 | | | 11/1993 |
| JP | 9-53309 | A | * | 2/1997 |
| JP | 9-331079 | | | 12/1997 |
| JP | 11-251608 | A | * | 9/1999 |
| JP | 11-307795 | A | * | 11/1999 |
| JP | 2000-299482 | A | * | 10/2000 |
| JP | 2001-47568 | A | * | 2/2001 |
| JP | 2001-53298 | A | * | 2/2001 |
| JP | 2001-98856 | A | * | 4/2001 |
| JP | 2001-168367 | A | * | 6/2001 |
| JP | 2002-106151 | A | * | 4/2002 |

OTHER PUBLICATIONS

Yoda et al., U.S. Appl. No. 09/250,053, filed Sep. 12, 2001.

* cited by examiner

PHOTOVOLTAIC MODULE HAVING LIGHT RECEPTIVE, GLASS LAMINATE STRUCTURE AND PHOTOVOLTAIC MODULE HAVING LIGHT RECEPTIVE, MULTI-LAYER STRUCTURE

BACKGROUND OF THE INVENTION

1. Field of the Invention

The present invention relates to photovoltaic modules having light receptive, glass laminate structures having a light receiving glass and a back-side, sealing glass arranged opposite each other, and photovoltaic modules having light receptive, multi-layer structures corresponding to that of the light receptive, glass laminate structure having on a side of the back-side, sealing glass a spacer interposed and glass is thus arranged, with the space sealing an inert gas, dry air or the like therein to provide a multi-layer structure.

2. Description of the Background Art

Conventionally in a solar power generation system for ordinary household residence, generally at a cover glass with a filler and a back sheet a solar battery cell is sealed to provide a photovoltaic module having a so-called super-straight structure which is in turn fixed therearound for example by an aluminum frame and fixed to a frame and thus installed on a roof. In recent years, as the photovoltaic module has increasingly prevailed, a photovoltaic module also functioning as a material for a roof has also increasingly prevailed. To provide the same for example a roof tile and a photovoltaic module are integrated together or a photovoltaic module has a back sheet with a metallic foil inserted therein to be fireproof so that it can pass a spark-proof test and thus serve as a roof tile.

Furthermore, as the residential photovoltaic module has increasingly prevailed, an "industrial solar battery" module has also remarkably prevailed for buildings, warehouses, gyms, and other similar public buildings capable of accommodating a large number of people. While a power generation system using a solar battery of an industrial field intended for buildings and the like significantly depends on a demand created by the NEDO field test project started in 1992, non-governmental, unique introduction of the same has recently also been increasingly intended.

Distinguished from those for ordinary households that generate power of approximately 3 kW, they are characterized in that: they generate power in as large a scale as no less than 10 kW and to install it is requires a large area; as it is required to serve as a "Building Integrated Photovoltaics" applied to a building it is considered in terms of design to satisfy the intention of the owner of the building; and various designs, structures and portions for installation are required, ranging from walls of buildings, curtain walls and other similar vertical installation to top lights, canopies, eaves and other similar, almost horizontal installation.

One such industrial photovoltaic module is a photovoltaic module having a light receptive, glass laminate structure. In this structure between a light receiving side (hereinafter also referred to as a front side, a side observed outdoors or an outdoor side, or the like) glass and a back surface (hereinafter also referred to as a backside, a side observed indoors or an indoor side, or the like) glass an intermediate layer of film sticking the light receiving glass and the backside glass together and a solar battery cell are sealed and a portion free of the solar battery cell accepts light.

The photovoltaic module having the light receptive, glass laminate structure structurally corresponds to a photovoltaic module having the super-straight structure having a backside back sheet replaced by a backside glass. With the solar battery cell-free portion accepting light effectively, and the light receiving glass and the backside glass that are formed of tempered glass to have a thickness designed to endure wind pressure and load, as required, to allow the module to be installed at a variety of locations, the module is significantly expected to satisfy a demand for a "Building Integrated Photovoltaics" and also satisfy a demand in construction. Furthermore as an industrial photovoltaic module there also exists a photovoltaic module having a light receptive, glass laminate structure with a spacer interposed to modify the module in multiple layers to provide a photovoltaic module having a light receptive, multi-layer structure that can be used as similarly as that of the light-receptive, glass laminate structure.

Conventionally, suppliers of solar battery cells had a mission to achieve mass production of more efficient cells with high tact and reduce a unit price thereof and market them. Considering a design of a visually unperceived portion of a conventional module contributes an increased cost of the module and such a consideration is in the first place not required, and it has thus been unnecessary to consider the aestheticism, design and the like of the cell's backside.

In contrast, the photovoltaic module having the light receptive, glass laminate structure, as described above, is significantly characterized in structure in that it corresponds to a photovoltaic module having a conventional super-straight structure with a backside-sealing film replaced by a backside glass. Thus, a backside of a solar battery cell, an interconnection on a backside of a matrix of solar battery cells, and other similar portions that are visually unperceived with the photovoltaic module having the super-straight structure, are seen through the backside glass. In other words, the solar battery cell would have a back surface with small marks thereon resulting from process steps, backside interconnections, and the like visually perceivable.

As such, if the module is used for a wall of a building, a top light or the like, the light receiving side, rather than the backside, is constantly observed indoors, and the design of a backside of a solar battery cell and a backside of an interconnection of a matrix of solar battery cells, which is not conventionally considered at all, is now a factor significantly affecting the product's value.

SUMMARY OF THE INVENTION

The present invention has been made to address the above issues and it contemplates a photovoltaic module having a light receptive, glass laminate structure and a photovoltaic module having a light receptive, multi-layer structure also allowing for aestheticism, design and the like for a conventionally unconsidered, external appearance of a backside of a solar battery cell.

The present invention has a configuration, as described hereinafter, as means for addressing the above issues.

(1) A photovoltaic module having a light receptive, glass laminate structure is formed of a light receiving glass and a backside glass with a plurality of solar battery cells and a translucent, intermediate layer posed therebetween, wherein the solar battery cell has a back surface with a film stuck thereon.

Thus, the light receptive, photovoltaic module having the glass laminate structure, as observed indoors on its backside, with the cell having a back surface with a lead frame, a mark of paste applied for collection of electricity and the like covered with the film, can have an external appearance improved in design and an increased value as a product.

(2) The film includes polyethylene telephthalate (PET) as basis material.

The film with PET serving as a base material is stuck on the back surface of the solar battery cell. PET is used as a back-side sealing material for a photovoltaic module having a conventional super-straight structure, and using the material can thus ensure reliability and contribute to reduced cost.

(3) An adhesive having a conductive substance distributed therein is used to adhere the film on the back surface of the solar battery cell.

Thus, the conductive substance existing in the adhesive surface of the film stuck on the cell's back surface can still ensure conductance when the back surface has a small crack, and if in fabricating the photovoltaic module having the light receptive, glass laminate structure at the step of inserting the intermediate layer of film and the solar battery cell in a glass laminate there exists a small crack introduced in the cell's back surface, the conductive substance can prevent a reduced output attributed to the crack and thus contribute to an enhanced yield.

(4) The film is each colored with a single, uniform color.

The solar battery cells have their respective back surfaces having stuck thereon their respective films colored with the same color. The colored film stuck on the cell's back surface can effectively achieve an improvement in design and the module having a plane entirely of a single color allows uniformity in design to be selected.

(5) The film is each colored with a color each selected arbitrarily.

Thus the solar battery cell has a back surface having stuck thereon a film each colored with a color each selected as desired. With the cell's back surface having stuck thereon a film of a color selected as desired, a design different from that in item (4) can be selected. Furthermore, with any color selected for each cell, a design forming a pattern can also be selected.

(6) The film is sized to have no more than an area equal to a single sheet of the solar battery cell.

Thus the solar battery cell has a back surface having stuck thereon a film sized to have an area equal to or less than a single sheet of solar battery cell. The film stuck on the cell's back surface that is sized to have an area equal to a single sheet of solar battery cell can effectively prevent people from being aware of the fact that the cell has the back surface with the film stuck thereon. Furthermore, if the film stuck on the cell's back surface is sized to be smaller than the cell, sticking the film effectively only on a most noticeable site, such as a mark of an interconnection of an interconector on the cell's back surface, allows the module to have an external appearance improved in design.

(7) The film is sized to be larger than a single sheet of the solar battery cell.

Thus the solar battery cell has a back surface having stuck thereon a film sized to be larger than a single sheet of solar battery cell. Thus, if a small number of solar battery cells are arranged within a plane of the module and large light acceptance is thus provided, changing the size of the film stuck on the cell's back surface can adjust the light acceptance to be smaller.

(8) The film is translucent.

Thus the solar battery cell can have a back surface having a translucent film stuck thereon. A further different design can thus be provided. Furthermore in the process for inspecting the fabrication the presence/absence for example of a crack in the cell's back surface can be inspected.

(9) The film is sized to cover no less than two, successive sheets of the solar battery cell.

Thus the solar battery cells have their back surfaces having stuck thereon a film sized to cover two or more solar battery cells successively. Light acceptance can thus be changed by different arrangements of the backside film and thus adjusted and selected, as desired, and different designs can also be provided.

(10) The film is sized to match the entirety of a surface of the photovoltaic module and it is continuous within an interconnection of a matrix of the solar battery cells.

Thus the solar battery cell has a back surface having stuck thereon a film sized to match the entirety of a surface of the photovoltaic module and continuous within an interconnection of a matrix of solar battery cells. As such, sticking a translucent film on the entirety of the back surface of the cell allows the film's optical transmittance to be utilized to adjust light accepted within a plane of the laminate glass at a portion free of solar battery cells, and if a colored film is used the light receptive portion can have a variation in color.

(11) A letter or a pattern is arranged on the film at a portion seen through the backside glass.

Thus the solar battery cell has a back surface having stuck thereon a film having a letter or a pattern at a portion seen through the backside glass. Thus a different design can effectively be provided and in addition providing a number or the like on a back surface of any cell can for example an identification for the module of interest.

(12) A photovoltaic module having a light receptive, glass laminate structure is formed of a light receiving glass and a backside glass with a plurality of solar battery cells and a translucent, intermediate layer of film posed therebetween, wherein the translucent, intermediate layer of film is colored.

Thus the photovoltaic module having the glass laminate structure is structured of a light receiving glass and a backside glass with a plurality of solar battery cells and a colored, intermediate translucent layer of film posed therebetween. The colored, intermediate layer of film sandwiching a solar battery cell posed in the glass laminate can provide a cell-free, light receptive portion with a novel design.

(13) The backside glass has an outer side having an entire surface with a translucent, colored film stuck thereon.

Thus in the photovoltaic module having the light receptive, glass laminate structure a translucent, colored film is stuck on the entirety of an outer side of the backside glass. Rather than sticking a covering film for each solar battery cell on the back surface, initially uniting the glasses to provide a laminate and then sticking the film across the entirety of the surface of the backside glass allows the cell to have a back surface with an interconnection mark effectively hardly perceivable, and if it is applied for example to a module with a solar battery cell having a back surface with a film directly stuck thereon or a module of a laminate glass with a colored intermediate film it can also provide a further different design.

(14) A translucent, colored film is stuck on the backside glass at a portion opposite the solar battery cell.

Thus there can be achieved an increased yield in the step of sticking the film, a reduced cost, and a novel design attributed to providing a portion between solar battery cells that is free of film stuck thereon.

(15) The photovoltaic module of the light receptive, glass laminate structure of any of items (1)–(14) and a indoor glass are arranged opposite each other, with a spacer posed therebetween to provide a multi-layer structure.

Thus the photovoltaic module having the light receptive, glass laminate structure that has a spacer posed between to modify the structure in multiple layers can provide a photovoltaic module having a light receptive, multi-layer structure, and selecting for example wire glass and using it as the indoor glass free of solar battery cells allows a light receptive, photovoltaic module to be used at a building site requiring a fire proof structure of a second type for example for a top light.

(16) The indoor glass has a surface with a translucent, colored film stuck thereon.

Thus a photovoltaic module having a light receptive, multi-layer structure has a indoor glass having one surface with a translucent, colored film stuck thereon. For glass having a multi-layer structure, this conveniently allows a solar battery cell to have a back surface with an interconnection mark thereon effectively, visually hardly perceivable and can also provide a novel design.

(17) A surface of the indoor glass that is opposite the photovoltaic module of the light receptive, glass laminate structure, and a surface of the photovoltaic module having the light receptive, glass laminate structure that is opposite the indoor glass, each has a polarizing, translucent film stuck thereon.

Thus, light acceptance can be changed by a difference in polarization direction between two sheets of polarizing film and it can thus be selected, as desired, effectively. In addition, a solar battery cell can have a back surface with an interconnection mark thereon effectively, visually hardly perceivable. Furthermore, combined with a variation in arrangement of solar battery cells of the photovoltaic module having the light receptive, glass laminate structure and a choice of the film stuck on the cell's back surface, there can be provided a novel design.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter a light receptive photovoltaic module of the present invention will be described in embodiments with reference to the drawings. It should be noted that the present invention is not limited to the configurations of a photovoltaic module of a light receptive, glass laminate structure and that of a light receptive, multi-layer structure described in the following embodiments with reference to the drawings.

First Embodiment

Figure 1:
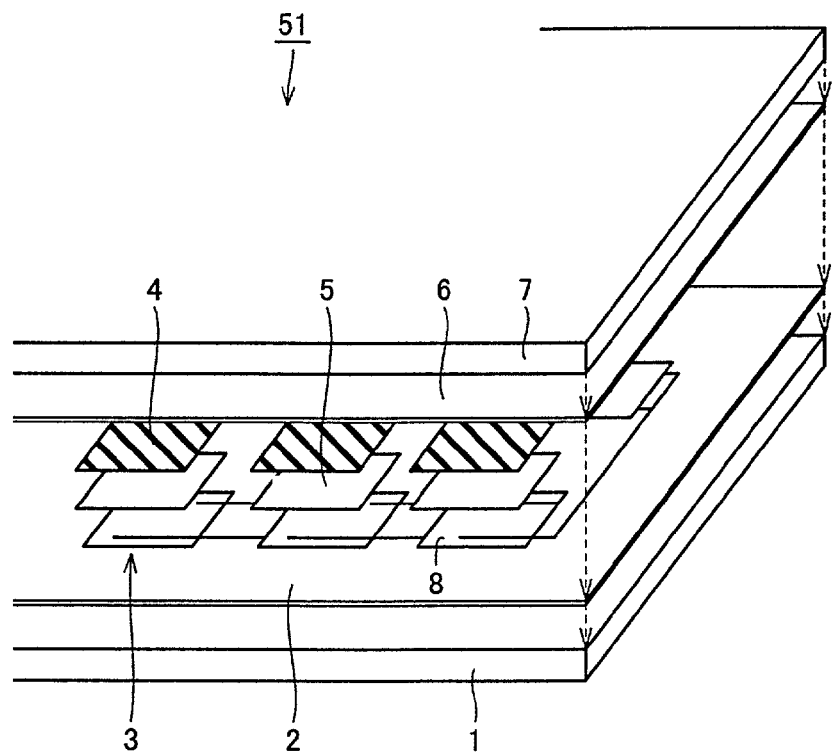
FIG. 1 is a perspective view of a structure of a photovoltaic module having a light receptive, glass laminate structure according to first to fourth embodiments.

With reference to FIG. 1, for a photovoltaic module 51 having a light-receptive, glass laminate structure, a 6 mm thick, white plate of tempered glass is used as a light receiving glass 1, thereon as an intermediate layer of film 2 ethylenevinylacetate (EVA) of 1.2 mm in thickness is interposed, and thereon is stacked a matrix 3 formed of a plurality of solar battery cells 8. Each cell 8 has a back surface with a film 4 stuck thereon with an adhesive layer 5. Film 4 is formed mainly of polyethylene telephthalate (PET) and it is cut and thus sized to have substantially the same size as cell 8. Adhesive layer 5 is a sheet or tape of acrylic adhesive of several micrometers to several tens micrometers in size. Furthermore thereon as an intermediate layer of film 6 EVA of 1.2 mm in thickness is further interposed and a 6 mm thick, blue plate of tempered glass is stacked as a backside glass 7.

The materials of the photovoltaic module that are thus set are united to provide a laminate for example by autoclaving, vacuum-lamination or other similar, known glass processing techniques. Cell 8 having a back surface with film 4 stuck thereon can provide a characteristic of the photovoltaic module 51 having the light receptive, glass laminate structure of the present invention.

As described above, solar battery cell 8 can have a back surface with a lead frame, a paste applied for collection of electricity and the like covered with film 4 and the photovoltaic module 51 having the light receptive, glass laminate structure, as observed indoors on the backside, can thus have an appearance improved in design and its value as a product can thus be enhanced effectively. Furthermore, film 4 stuck on the cell 8 back surface uses PET used as a material for sealing a back surface of a photovoltaic module having a conventional super straight structure, and it thus ensures reliability and can contribute to reduced cost effectively. Furthermore, film 4 stuck on the cell 8 back surface can be sized to have approximately the same area as a single sheet of cell 8, and photovoltaic module 51 having the light receptive, glass laminate structure, as observed indoors on the backside, can be observed without an awareness that cell 8 has a back surface with a film stuck thereon.

Furthermore, if a lead frame, a paste applied for collection of electricity and the like on the cell 8 back surface are hardly noticeable then the film stuck thereon can be sized smaller than the cell. In this case, the module can have an appearance effectively improved in design by effectively sticking the film only at a most noticeable portion, such as a mark of an interconnection of an interconnector of a back surface of the cell.

It should be noted that the thickness of the glass and the thickness and type of the intermediate layer of film are not limited to the above.

Second Embodiment

The present invention in a second embodiment provides a photovoltaic module 51 having a light receptive, glass laminate structure, with a PET-based film 4 stuck on a back surface of solar battery cell 8 by an adhesive layer 5 provided in the form of a conductive, adhesive sheet of an acrylic adhesive with powdery nickel, powdery carbon or any other similar conductive substance distributed therein. The other materials and the method of fabricating the module are identical to those as described in the first embodiment.

A conductive substance can exist in an adhesive surface of film 4 stuck on a back surface of solar battery cell 8, and if cell 8 has a small crack in the back surface, conductance can still be ensured. Thus, if in inserting the intermediate layer of film 6 and solar battery cell matrix 3 between light receiving glass 1 and backside glass 7 to fabricate photovoltaic module 51 solar 8 has small cracks in the back surface the module can still be prevented from providing reduced outputs and contribute to increased yield effectively.

Third Embodiment

The present invention in a third embodiment provides a photovoltaic module 51 having a light receptive, glass laminate structure, with solar battery cell 8 having a back surface with film 4 stuck thereon that is colored with a single, uniform color. The other materials and the method of fabricating the module are identical to those described in the first embodiment. Photovoltaic module 51, as observed on the back side, can provide a design in which cells 8 have their respective back surfaces unified by a single color.

Fourth Embodiment

The present invention in a fourth embodiment provides a photovoltaic module 51 having a light receptive, glass laminate structure, with solar battery cell 8 having a back surface with film 4 stuck thereon that is colored with a color selected for each cell, as desired. The other materials and the method of fabricating the module are identical to those described in the first embodiment. Photovoltaic module 51, as observed on the back side, can thus provide a design in which each cell 8 is colored as desired.

Fifth Embodiment

Figure 2:
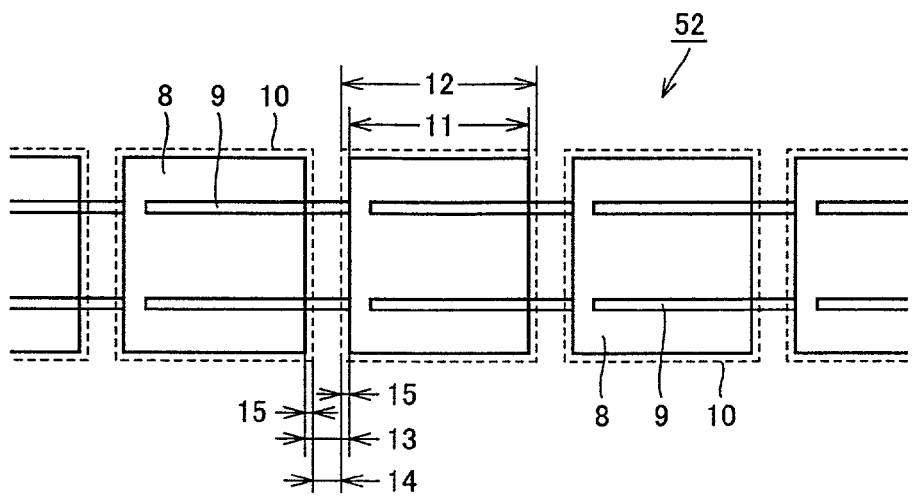
FIG. 2 is a top view of a photovoltaic module having a light receptive, glass laminate structure according to fifth and sixth embodiments.

With reference to FIG. 2, a photovoltaic module 52 having a light receptive, glass laminate structure is formed of the same materials and fabricated in the same method as module 51 described in the first embodiment, except that solar battery cell matrix 3 is formed of solar battery cell 8 having a back surface having stuck thereon a film 10 larger in size than a single sheet of the cell.

More specifically, cell 8 has a size 11 of 125 mm by 125 mm and it has a back surface with film 10 having a size 12 of 135 mm by 135 mm stuck thereon. Cell 8 is interconnected by an interconnector 9 in a matrix to form solar battery matrix 3. If cells are spaced 13 by 30 mm and thus interconnected, sticking the film of 135 mm×135 mm thereto provides an apparent spacing 14 smaller by 5 mm on each of the right and left (or upper and lower) sides. In other words, a reduced spacing 15 is 5 mm at each of opposite ends and, as observed indoors on the back side, there can be obtained the same design as provided when a solar battery cell of 135 mm×135 mm is used and such cells are spaced by 20 mm. Furthermore, with cell 8 having a back surface with film 10 stuck thereon that is larger in size than a single sheet of the cell, light acceptance can be adjusted to have a smaller value depending on the size of the film stuck on the cell's back surface.

Sixth Embodiment

In accordance with the present invention in a sixth embodiment solar battery cell 8 has a back surface with translucent film 10 stuck thereon. The other materials and the method of fabricating the module are identical to those described in the fifth embodiment. For example in the photovoltaic module 52 of the light receptive, glass laminate structure film 10 can be formed for example of translucent, colored PET. Thus a different design can be provided and furthermore in a fabrication inspection process the presence/absence for example of cracks in a back surface of cell 8 can be inspected.

Seventh Embodiment

Figure 3:
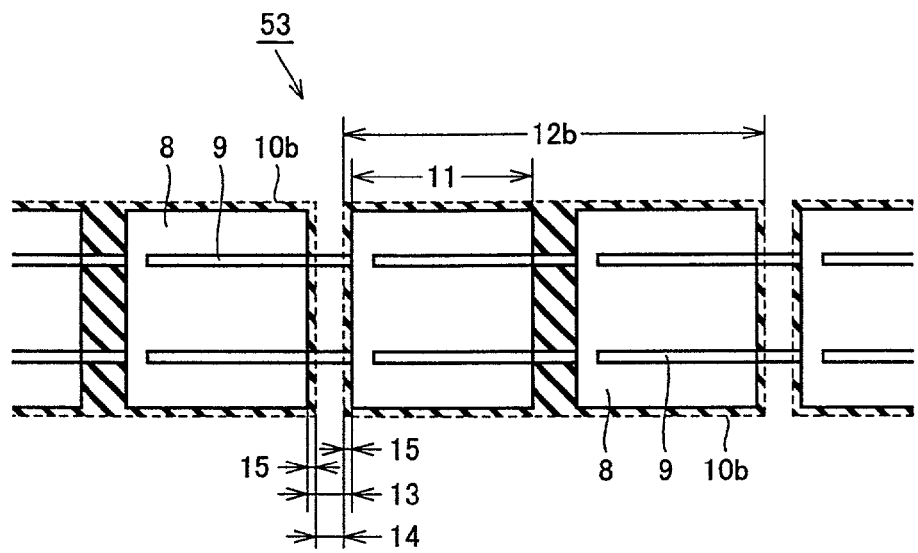
FIG. 3 is a top view of a photovoltaic module having a light receptive, glass laminate structure according to a seventh embodiment.

With reference to FIG. 3, while it is formed of the same material and fabricated in the same method as the first embodiment, a photovoltaic module 53 having a light receptive, glass laminate structure uses solar battery cell 8 having a back surface with a film 10*b* stuck thereon and covering two sheets or more of solar battery cell continuously. More specifically, as shown in FIG. 3, cell 8 has a size of 125 mm×125 mm and is spaced 13 by 30 mm and thus connected, and it has a back surface having stuck thereon film 10*b* having a size 12*b* of 135 mm×290 mm, two sheets of cell 8 are covered with a single backside film 10*b*, and while between the cells the film exists, it does not in a direction of a series interconnection every two cells at one spacing, and a different design can thus be provided. Furthermore, a further different design can be provided if film 10*b* is translucent colored film.

It should be noted that film 10 may be stuck on every three or more sheets of cell 8 at their back surfaces to provide different designs. It should be noted that the present embodiment is not applicable together with the second embodiment, since covering two sheets or more of solar battery cell continuously with a conductive substance introduces leakage in a solar cell series interconnection.

Eighth Embodiment

Figure 4:
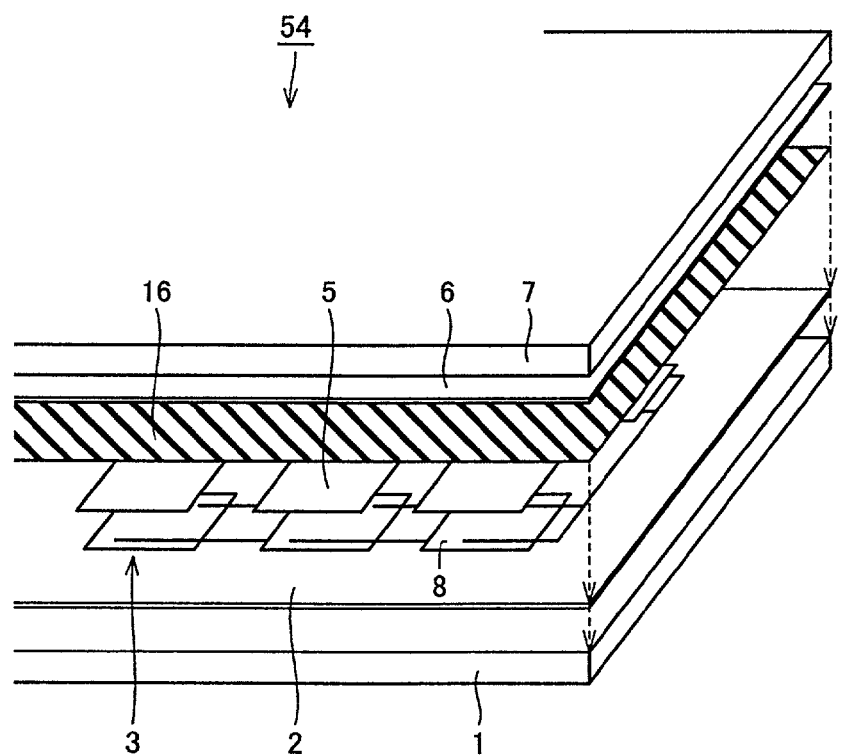
FIGS. 4–9 are perspective views of structures of photovoltaic modules having light receptive, glass laminate structures according to a eighth to thirteenth embodiments, respectively.

With reference to FIG. 4, a photovoltaic module 54 having a light receptive, glass laminate structure is formed of the same material and fabricated in the same method as the first embodiment, except that solar battery cell 8 has a back surface with translucent, colored film 16 stuck thereon. Translucent, colored film 16 is sized to match an entire plane of the photovoltaic module and it is continuous within an interconnection of solar battery cell matrix 3. Cell 8 with the back surface covered with film 16 can have a mark of its interconnection visually hardly perceivable and in addition between cells through film 16 light can be introduced. Thus a design different than for example the first and seventh embodiments can thus be provided.

Note that the present embodiment is not applicable together with the second embodiment, since covering two sheets or more of cell continuously with a conductive substance introduces leakage in a solar cell series interconnection.

Ninth Embodiment

Figure 5:
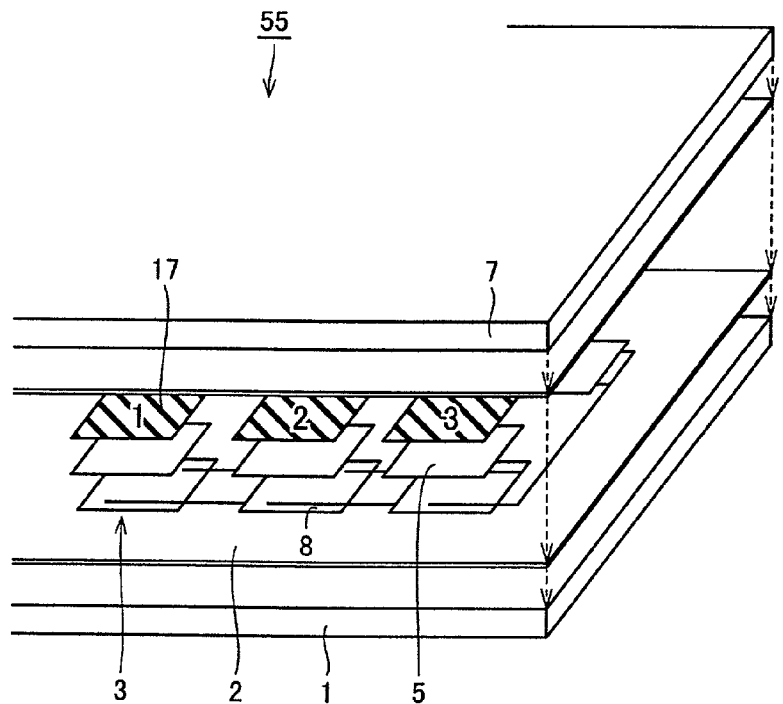

With reference to FIG. 5, a photovoltaic module 55 having a light receptive, glass laminate structure is formed of the same material and fabricated in the same method as the first embodiment, except that letters, patterns and the like are arranged on a portion of a film stuck on a back surface of solar battery cell 8 that can be seen through backside glass 7. For example, as shown in FIG. 5, if a backside film 17 having a letter thereon is stuck on a back surface of cell 8, it can be used to identify the photovoltaic module of interest and it can also provide a design. The letters, patterns and the like shown in the present embodiment are merely one example and with the concept of the present invention a variety of applications allow light receptive, photovoltaic modules having various designs.

Tenth Embodiment

Figure 6:
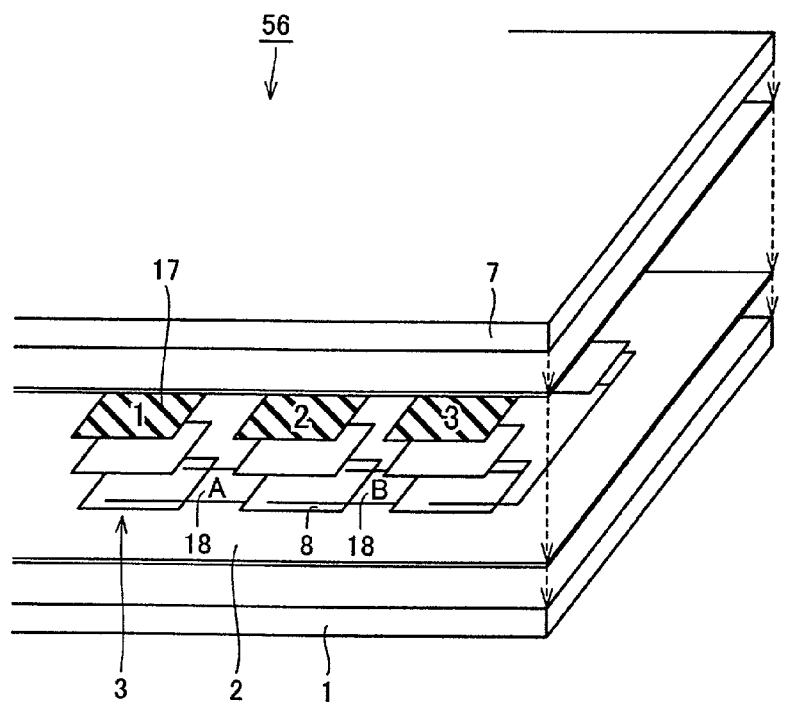

With reference to FIG. 6, a photovoltaic module 56 having a light receptive, glass laminate structure corresponds to the module 55 as shown in FIG. 5 with solar battery cells sandwiching a letter, a pattern or the like punched through a film 18 arranged to form a design. The letter, pattern or the like shown in the present embodiment is merely one example and with the concept of the present invention a variety of applications allow light receptive, photovoltaic modules providing different designs.

Eleventh Embodiment

Figure 7:
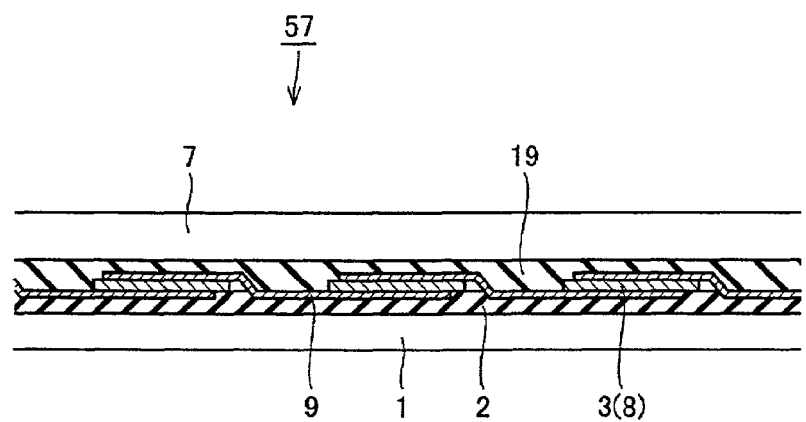

FIG. 7 shows a photovoltaic module 57 having a light receptive, glass laminate structure employing a glass laminate formed of light receiving glass 1 and backside glass 7 with solar battery cell matrix 3 posed therebetween, sandwiched by an intermediate film that is colored. In this example, film 4 and adhesive layer 5 are not provided. The other materials and the method of fabricating the module are identical to those described in the first embodiment.

More specifically, between light receiving glass 1 and matrix 3 there is inserted an intermediate layer of film 2 similarly as described in the first embodiment and between a back surface of matrix 3 and backside glass 7 there is inserted an intermediate film that is colored, i.e., a colored intermediate layer of film 19. It can be formed of colored EVA having inorganic pigment distributed and blended therein. Thus cell 8 can have a back surface with a mark of its connection effectively; visually hardly perceivable and a cell 8-free, light receptive portion can effectively be provided with a novel design.

Twelfth Embodiment

Figure 8:
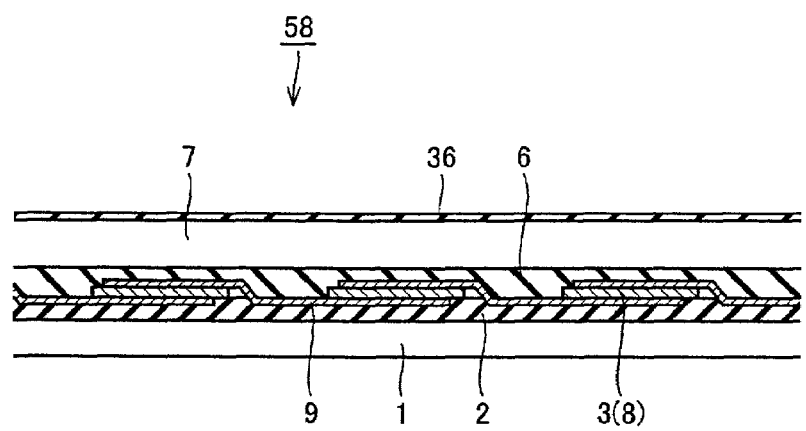

With reference to FIG. 8, a photovoltaic module 58 having a light receptive, glass laminate structure corresponds to the photovoltaic module 57 having the light receptive, glass laminate structure with backside glass 7 having an outer side (a side observed indoors) having a surface with a colored, translucent film 36 stuck thereon entirely. More specifically, colored, translucent film 36 can for example be translucent, colored PET. Furthermore, the photovoltaic modules having the light receptive, glass laminate structures of the present invention in the first to tenth embodiments can be employed with colored, translucent film 36. The present invention is a method most readily allowing solar battery cell 8 to have a back surface with an interconnection mark thereof visually hardly perceivable. Since backside glass 7 has an outer side (a side observed indoors) basically different from an indoor side, the exact, colored, translucent film 36 stuck thereon may be lower in weatherability than that exposed outdoors and effectively it can also be exchanged.

Thirteenth Embodiment

Figure 9:
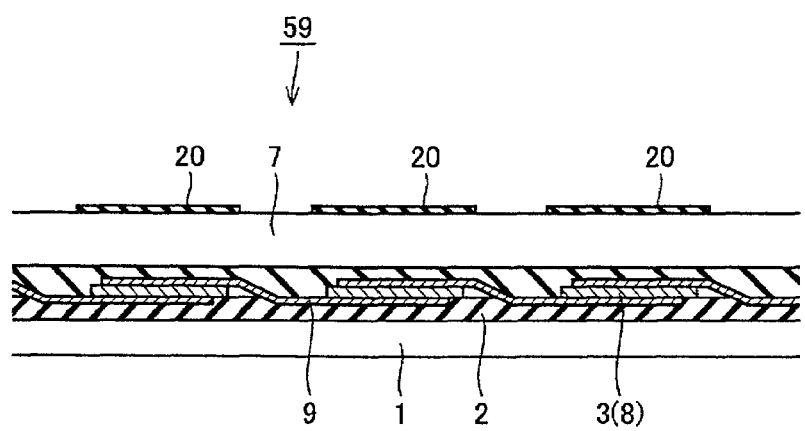

With reference to FIG. 9, a photovoltaic module 59 having a light receptive, glass laminate structure is formed of the same materials and fabricated in the same method as the twelfth embodiment, except that colored, translucent film 36 stuck on the entirety surface of the outer side of backside glass 7 is replaced by a divided film 20 each stuck on the outer side of backside glass 7 that is opposite a backside of solar battery cell 8. Thus a sticking step can be increased in yield and reduced in cost. Furthermore a portion between cells that does not have a film stuck thereon can effectively provide a novel design.

Fourteenth Embodiment

Figure 10:
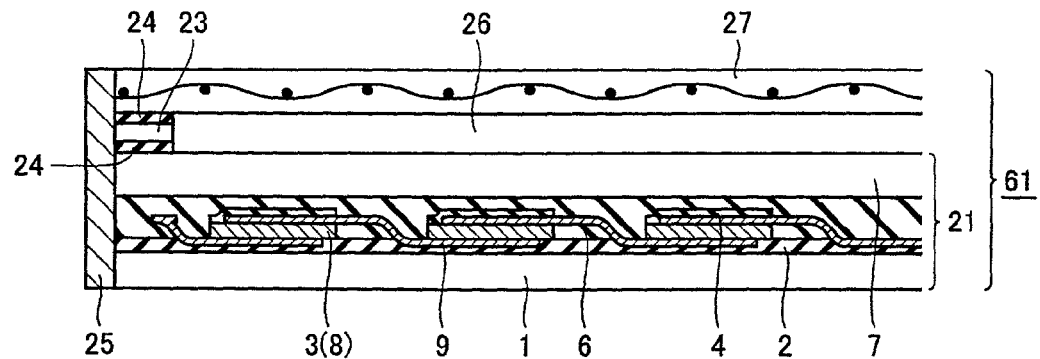
FIG. 10 generally shows a structure of a photovoltaic module having a light receptive, multi-layer structure according to a fourteenth embodiment.

With reference to FIG. 10 in this embodiment the photovoltaic modules having the light receptive, glass laminate structures fabricated in the first through twelfth embodiments are modified by a known, multi-layer glass processing technique to have a multi-layer structure. Thus the solar batteries having the light receptive, glass laminate structures of the first to thirteenth embodiments can be modified to be those having a light receptive, multi-layer glass structure. In particular if the glass observed indoors is wire glass it can be used for a portion requiring a fire-proof structure of a second type and it can for example be applied to a top light.

In FIG. 10, by way of example, the photovoltaic module 21 of the light receptive, glass laminate structure described in the first embodiment is modified by inserting a clearance spacer 23 and it is thus provided in multiple layers. In clearance 26, as well as in a solar battery having a conventional, light receptive, multi-layer glass structure, dry air, inert gas or the like is sealed. Furthermore, a primary seal 24 of butyl rubber and a secondary seal 25 of polysulfide are used to seal the battery as similarly as a solar battery having a conventional, light receptive, multi-layer glass structure. Glass observed indoors 27 provided in multiple layers is wire glass of 6.8 mm in thickness. In this manner a photovoltaic module having a light receptive, multi-layer glass structure 61 can be configured.

Fifteenth Embodiment

Figure 11:
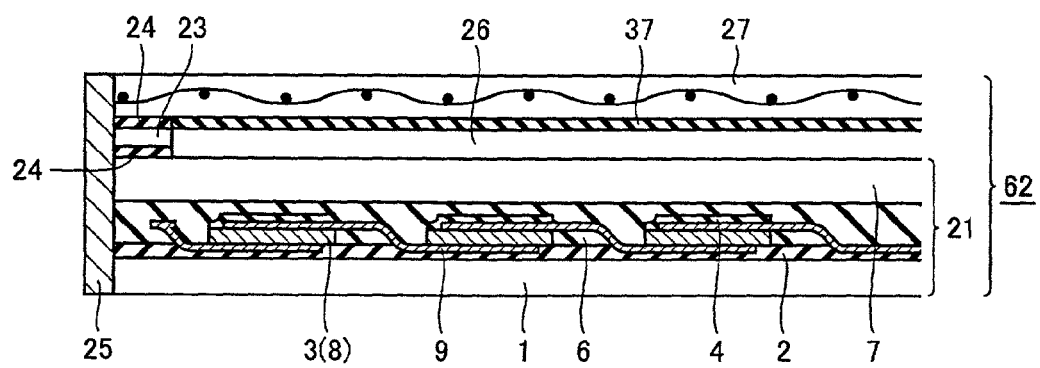
FIG. 11 is a cross section of a structure of a photovoltaic module having a light receptive, multi-layer glass structure according to a fifteenth embodiment.

With reference to FIG. 11, a photovoltaic module 62 having a light receptive, multi-layer glass structure corresponds to module 61 with multi-layer glass observed indoors (i.e., glass free of a solar battery cell) 27 having an inner or outer side with colored, translucent film 37 stuck thereon. Thus, solar battery cell 8 can have a back surface with an interconnection mark thereof effectively, visually hardly perceivable and in addition the photovoltaic modules of the light receptive, glass laminate structures of the first to thirteenth embodiments can be modified by the present invention in multiple layers and an effect of a combination can thus provide a novel design. The film stucked to the glass may be sized to match an entire surface of glass observed indoors 27 or a size covering any number of successive sheets of solar battery cells at their respective back surfaces, and it can be determined, as desired, although consideration should be given to the clearance of clearance spacer 23 for providing the module in a multi-layer structure, the aestheticism as seen on the backside, and the thickness of the glass.

Furthermore, if colored, translucent film 37 is stuck on an inner side of multi-layer glass observed indoors (i.e., glass free of a solar battery cell) 27, i.e., it is stuck in clearance 26 then there does not exist a film as a combustible on a side of module 61 that is observed indoors and the module can thus be applied to an architectural portion requiring a fire-proof structure.

Sixteenth Embodiment

Figure 12:
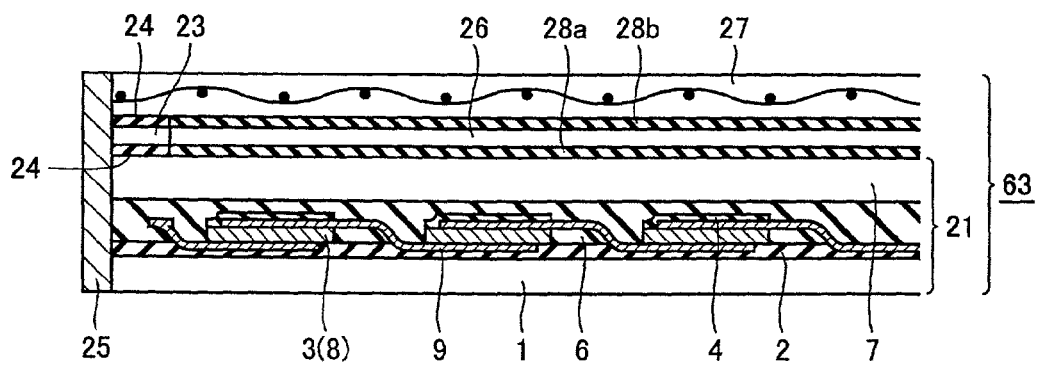
FIG. 12 is a cross section of a structure of a photovoltaic module having a light receptive, multi-layer structure according to a sixteenth embodiment.

With reference to FIG. 12, a photovoltaic module 63 having a light receptive, multi-layer structure corresponds to module 61 in which polarizing, translucent films 28*a*, 28*b* are stuck on an inner side of multi-layer glass observed indoors (or glass free of a solar battery cell) 27 (i.e., a side opposite a photovoltaic module having a glass laminate structure) and on backside glass 7 of a photovoltaic module having a glass laminate structure (i.e., a side opposite the glass observed indoors), in different directions of polarization. If the two polarizing, translucent films have their directions of polarization orthogonal to each other then light acceptance is minimized and if the two films have the same direction of polarization then light acceptance is maximized. By selecting a direction of polarization of the two polarizing films, as required, any light acceptance, design and the like can be adjusted.

Thus in the present invention a conventionally unconsidered external appearance of a back surface of a solar battery cell of a light receptive photovoltaic module can be improved and thus provide a further, novel design to allow module technology to create a better, externally observed design and also market an inexpensive and novel photovoltaic module and contribute to increased industrial demand.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A photovoltaic module having a light receptive, glass laminate structure formed of a light receiving glass and a backside glass with a plurality of solar battery cells and a first translucent intermediate layer arranged between the light receiving glass and the plurality of solar battery cells and a second translucent intermediate layer arranged between the backside glass and the plurality of solar battery cells, wherein at least one of the plurality of solar battery cells has a back surface with a film thereon and an adhesive having an electrically conductive substance distributed therein is used to adhere said film on said back surface of the at least one solar battery cell, and wherein the adhesive is provided only on said at least one of the plurality of solar battery cells so that the adhesive is not provided conductively between different solar battery cells.

2. A photovoltaic module comprising:
a light receptive, glass laminate structure comprising a light receiving glass and a backside glass with a plurality of solar battery cells and a first translucent intermediate layer arranged between the light receiving glass and the plurality of solar battery cells and a second translucent intermediate layer arranged between the backside glass and the plurality of solar battery cells,
wherein at least one of the plurality of solar battery cells has a back surface with a film adhered thereon with an adhesive having an electrically conductive substance distributed therein and said film includes polyethylene telephthalate (PET) as basis material, and wherein the adhesive is provided only on said at least one of the plurality of solar battery cells so that the adhesive is not provided conductively between different solar battery cells.

3. A photovoltaic module comprising:
a light receptive, glass laminate structure comprising a light receiving glass and a backside glass with a plurality of solar battery cells and a first translucent intermediate layer arranged between the light receiving glass and the plurality of solar battery cells and a second translucent intermediate layer arranged between the backside glass and the plurality of solar battery cells,
wherein each of the plurality of solar battery cells has a back surface with a respective film thereon, so that a plurality of the films are provided so that a separate film is adhered to a back surface of each of the solar battery cells with an adhesive having an electrically conductive substance distributed therein, and each said film is colored with a single, uniform color, and
wherein the adhesive is provided only on said solar battery cells so that the adhesive is not provided conductively between different solar battery cells.

4. The photovoltaic module comprising the light receptive, glass laminate structure according to claim 3, wherein each said film is translucent.

5. A photovoltaic module comprising:
a light receptive, glass laminate structure comprising a light receiving glass and a backside glass with a plurality of solar battery cells and a first translucent intermediate layer arranged between the light receiving glass and the plurality of solar battery cells and a second translucent intermediate layer arranged between the backside glass and the plurality of solar battery cells,
wherein each of the plurality of solar battery cells has a back surface with a respective film adhered thereon with an adhesive having an electrically conductive substance distributed therein and each said film is colored with a color selected arbitrarily, and wherein the adhesive is provided only on said solar battery cells so that the adhesive is not provided conductively between different solar battery cells.

6. A photovoltaic module comprising:
a light receptive, glass laminate structure comprising a light receiving glass and a backside glass with a plurality of solar battery cells and a first translucent intermediate layer arranged between the light receiving glass and the plurality of solar battery cells and a second translucent intermediate layer arranged between the backside glass and the plurality of solar battery cells, wherein each of the plurality of solar battery cells has a back surface with a respective film adhered thereon with an adhesive having an electrically conductive substance distributed therein and each said film is of the same shape as the shape of a corresponding sheet of a corresponding solar battery cell and is sized to have no more than an area equal to a single sheet of solar battery cell, and wherein the adhesive is provided only on said solar battery cells so that the adhesive is not provided conductively between different solar battery cells.

7. A photovoltaic module comprising:
a light receptive, glass laminate structure formed of a light receiving glass and a backside glass with a plurality of solar battery cells and a first translucent intermediate layer arranged between the light receiving glass and the plurality of solar battery cells and a second translucent intermediate layer arranged between the backside glass and the plurality of solar battery cells, wherein each of the plurality of solar battery cells has a back surface with a respective film adhered thereon with an adhesive having an electrically conductive substance distributed therein and each said film is of the same shape as the shape of a corresponding sheet of a corresponding solar battery cell and is sized to be larger than a single sheet of solar battery cell, and wherein the adhesive is provided only on said solar battery cells so that the adhesive is not provided conductively between different solar battery cells.

8. A photovoltaic module having a light receptive, glass laminate structure formed of a light receiving glass and a backside glass with a plurality of solar battery cells and a first translucent intermediate layer arranged between the light receiving glass and the plurality of solar battery cells and a second translucent intermediate layer arranged between the backside glass and the plurality of solar battery cells, wherein each said solar battery cell has a back surface with a film adhered thereon with an adhesive having an electrically conductive substance distributed therein and said film is sized to cover no less than two, successive sheets of said solar battery cells, and wherein the adhesive is provided only on said solar battery cells so that the adhesive is not provided conductively between different solar battery cells.

9. A photovoltaic module having a light receptive, glass laminate structure formed of a light receiving glass and a backside glass with a plurality of solar battery cells and a first translucent intermediate layer arranged between the light receiving glass and the plurality of solar battery cells and a second translucent intermediate layer arranged between the backside glass and the plurality of solar battery cells,
wherein at least one of the plurality of solar battery cells has a back surface with a film thereon and a letter or a pattern is arranged on said film at a portion seen through said backside glass, and wherein the film is adhered to the back surface of the solar battery cell with an adhesive having an electrically conductive substance distributed therein, and wherein the adhesive is provided only on said at least one of the plurality of solar battery cells so that the adhesive is not provided conductively between different solar battery cells.

10. A photovoltaic module having a light receptive, glass laminate structure formed of a light receiving glass and a backside glass with a plurality of solar battery cells and a first translucent intermediate layer arranged between the light receiving glass and the plurality of solar battery cells and a second translucent intermediate layer arranged between the backside glass and the plurality of solar battery cells, wherein at least one of the plurality of solar battery cells has a back surface with a film adhered thereon with an adhesive having an electrically conductive substance distributed therein and said backside glass has an outer side having an entire surface with a translucent, colored film thereon, and wherein the adhesive is applied only on said at least one of the plurality of solar battery cells so that the adhesive is not provided conductively between different solar battery cells.

11. A photovoltaic module having a light receptive, glass laminate structure formed of a light receiving glass and a backside glass with a plurality of solar battery cells and a first translucent intermediate layer arranged between the light receiving glass and the plurality of solar battery cells and a second translucent intermediate layer arranged between the backside glass and the plurality of solar battery cells, wherein at least one of the plurality of solar battery cells has a back surface with a film adhered thereon with an adhesive having an electrically conductive substance distributed therein and a translucent, colored film is provided on said backside glass at a portion opposite said solar battery cells, and wherein the adhesive is applied only on said at least one of the plurality of solar battery cells so that the adhesive is not provided conductively between different solar battery cells.

12. A photovoltaic module having a light receptive, multi-layer structure formed of a photovoltaic module having a light receptive, glass laminate structure formed of a light receiving glass and a backside glass with a plurality of solar battery cells and a first translucent intermediate layer arranged between the light receiving glass and the plurality of solar battery cells and a second translucent intermediate layer arranged between the backside glass and the plurality of solar battery cells, wherein at least one of the plurality of solar battery cells has a back surface with a film thereon, and wherein the film is adhered to the back surface of the solar battery cell with an adhesive having an electrically conductive substance distributed therein, and an indoor glass arranged opposite the photovoltaic module of the light receptive, glass laminate structure, said photovoltaic module of the light receptive, glass laminate structure and said indoor glass having a spacer therebetween to provide a multi-layer structure, and wherein the adhesive is applied only on said at least one of the plurality of solar battery cells so that the adhesive is not provided conductively between different solar battery cells.

13. A photovoltaic module having a light receptive, multi-layer structure formed of a photovoltaic module having a light receptive, glass laminate structure formed of a light receiving glass and a backside glass with a plurality of solar battery cells and a first translucent intermediate layer arranged between the light receiving glass and the plurality of solar battery cells and a second translucent intermediate layer arranged between the backside glass and the plurality of solar battery cells, wherein each of the plurality of solar battery cells has a back surface with a respective film thereon and each said film is colored with a single, uniform color, and wherein the respective films are adhered to the back surfaces of the solar battery cells with an adhesive having an electrically conductive substance distributed therein; and an indoor glass arranged opposite the photovoltaic module of the light receptive, glass laminate structure, said photovoltaic module of the light receptive, glass laminate structure and said indoor glass having a spacer therebetween to provide a multi-layer structure, wherein said indoor glass has a surface with a translucent, colored film thereon, and wherein the adhesive is applied only on said solar battery cells so that the adhesive is not provided conductively between different solar battery cells.

14. A photovoltaic module having a light receptive, multi-layer structure formed of a photovoltaic module having a light receptive, glass laminate structure formed of a light receiving glass and a backside glass with a plurality of solar battery cells and a first translucent intermediate layer arranged between the light receiving glass and the plurality of solar battery cells and a second translucent intermediate layer arranged between the backside glass and the plurality of solar battery cells, wherein each of the plurality of solar battery cells has a back surface with a respective film thereon and each said film is colored with a single, uniform color, and wherein the respective films are adhered to the back surfaces of the solar battery cells with an adhesive having an electrically conductive substance distributed therein; and an indoor glass arranged opposite the photovoltaic module of the light receptive, glass laminate structure, said photovoltaic module of the light receptive, glass laminate structure and said indoor glass having a spacer therebetween to provide a multi-layer structure wherein a surface of said indoor glass that is opposite said photovoltaic module of said light receptive, glass laminate structure, and a surface of said photovoltaic module having said light receptive, glass laminate structure that is opposite said indoor glass, each has a polarizing, translucent film thereon, and wherein the adhesive is applied only on said solar battery cells so that the adhesive is not provided conductively between different solar battery cells.

15. A photovoltaic module having a light receptive, glass laminate structure formed of a light receiving glass and a backside glass with a plurality of solar battery cells and a first translucent intermediate layer arranged between the light receiving glass and the plurality of solar battery cells and a second translucent intermediate layer arranged between the backside glass and the plurality of solar battery cells, wherein at least one of said translucent intermediate layers is colored, and said backside glass at a portion opposite each of the plurality of cells is provided with a respective one of translucent, colored divided films, and wherein the films are adhered to the back surfaces of the solar battery cells with an adhesive having an electrically conductive substance distributed therein, and wherein the adhesive is applied only on said solar battery cells so that the adhesive is not provided conductively between different solar battery cells.

16. A photovoltaic module having a light sensitive, multi-layer structure, formed of a photovoltaic module having a light receptive, glass laminate structure formed of a light receiving glass and a backside glass with a plurality of solar battery cells and a first translucent intermediate layer arranged between the light receiving glass and the plurality of solar battery cells and a second translucent intermediate layer arranged between the backside glass and the plurality of solar battery cells, wherein at least one of said translucent, intermediate layers is colored; and an indoor glass arranged opposite the photovoltaic module of the light receptive, glass laminate structure, said photovoltaic module of the light receptive, glass laminate structure and said indoor glass having a spacer therebetween to provide a multi-layer structure; and wherein at least one of the plurality of solar battery cells has a back surface with a film thereon, wherein the film is adhered to the back surface of the solar battery cell with an adhesive having an electrically conductive substance distributed therein, and wherein the adhesive is applied only on said at least one of the plurality of solar battery cells so that the adhesive is not provided conductively between different solar battery cells.

17. A photovoltaic module having a light sensitive, multi-layer structure, formed of a photovoltaic module having a light receptive, glass laminate structure formed of a light receiving glass and a backside glass with a plurality of solar battery cells and a first translucent intermediate layer arranged between the light receiving glass and the plurality of solar battery cells and a second translucent intermediate layer arranged between the backside glass and the plurality of solar battery cells, wherein at least one of said translucent, intermediate layers is colored; and an indoor glass arranged opposite the photovoltaic module of the light receptive, glass laminate structure said photovoltaic module of the light receptive, glass laminate structure and said indoor glass having a spacer therebetween to provide a multi-layer structure, and wherein said indoor glass has a surface with a translucent, colored film stuck thereon; and wherein at least one of the plurality of solar battery cells has a back surface with a film thereon, wherein the film is adhered to the back surface of the solar battery cell with an adhesive having an electrically conductive substance distributed therein, and wherein the adhesive is applied only on said at least one of the plurality of solar battery cells so that the adhesive is not provided conductively between different solar battery cells.

18. A photovoltaic module having a light sensitive, multi-layer structure, formed of a photovoltaic module having a light receptive, glass laminate structure formed of a light receiving glass and a backside glass with a plurality of solar battery cells and a first translucent intermediate layer arranged between the light receiving glass and the plurality of solar battery cells and a second translucent intermediate layer arranged between the backside glass and the plurality of solar battery cells, wherein at least one of said translucent, intermediate layers is colored; and an indoor glass arranged opposite the photovoltaic module of the light receptive, glass laminate structure, said photovoltaic module of the light receptive, glass laminate structure and said indoor glass having a spacer therebetween to provide a multi-layer structure, and wherein a surface of said indoor glass that is opposite said photovoltaic module of said light receptive, glass laminate structure, and a surface of said photovoltaic module having said light receptive, glass laminate structure that is opposite said indoor glass, each has a polarizing, translucent film stuck thereon; and wherein at least one of the plurality of solar battery cells has a back surface with a film thereon, wherein the film is adhered to the back surface of the solar battery cell with an adhesive having an electrically conductive substance distributed therein, and wherein the adhesive is applied only on said at least one of the plurality of solar battery cells so that the adhesive is not provided conductively between different solar battery cells.

* * * * *